United States Patent
Fujita

(10) Patent No.: US 6,529,083 B2
(45) Date of Patent: *Mar. 4, 2003

(54) CLOCK CONTROL CIRCUIT

(75) Inventor: Atsushi Fujita, Kanagawa (JP)

(73) Assignee: Fujitsu Limited, Kawasaki (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/538,523

(22) Filed: Mar. 30, 2000

(65) Prior Publication Data

US 2002/0047748 A1 Apr. 25, 2002

(30) Foreign Application Priority Data

Aug. 12, 1999 (JP) ............................................. 11-228678

(51) Int. Cl.$^7$ ................................................. H03B 1/00
(52) U.S. Cl. ..................... 331/49; 331/74; 331/DIG. 2; 327/144; 327/147; 327/150
(58) Field of Search ........................ 331/49, 74, DIG. 2; 713/503; 375/376; 327/144, 147, 150

(56) References Cited

U.S. PATENT DOCUMENTS 5,142,247 A * 8/1992 Lada, Jr. et al. ............... 331/14
5,903,748 A * 5/1999 McCollough et al. ......... 73/503

* cited by examiner

*Primary Examiner*—Arnold Kinkead
(74) *Attorney, Agent, or Firm*—Arent Fox Kintner Plotkin Kahn

(57) ABSTRACT

In a clock control circuit, a multiplication factor setting unit outputs a multiplication factor. A buffer circuit holds a previous multiplication factor and the multiplication factor output by the multiplication factor setting unit and compares the two multiplication factors. When the multiplication factors are different from each other, a clock state control circuit provides a control to, stop the output of clock to the outside, switch the clock to a clock other than those output by the PLL oscillation circuit, change the multiplication factor in the PLL oscillation circuit, switch the clock to clock output by the PLL oscillation circuit after the PLL output clock is stabilized, and restart output of the clock to the outside.

19 Claims, 5 Drawing Sheets

CLOCK CONTROL CIRCUIT

FIELD OF THE INVENTION

The present invention relates to a clock control circuit in a microcontroller.

BACKGROUND OF THE INVENTION

In recent years, requirements for power conditions in portable telephone or other portable equipment have been becoming more and more strict. In association with this tendency, also the requirement for lower power consumption in an incorporated microcontroller for controlling the portable equipment or the like has been becoming increasingly strong. At the same time, contents of control provided from or the processing executed by the microcontroller has been becoming more and more complicated. To satisfy the requirements described above, it is necessary to see that the microcontroller works at a higher speed, but in this case power consumption per unit time increases.

Therefore, complicated control over the operating speed is performed. In other words, the microcontroller is operated at a higher speed during a period of time when or for sections in which the high processing capability is required, and operated at a lower speed during a period of time when or for sections in which the high processing capability is not required.

In order to change the operating speed of a microcontroller, generally the frequency of the operating clock must be changed. The frequency is generally changed by a multiplication factor in a PLL (phase-locked Loop) oscillation circuit, or by changing a frequency division ratio in a frequency divider circuit. The PLL oscillation circuit is mainly used for the generation of a single operation clock with a higher frequency from a low original oscillation clock. The frequency divider circuit is mainly used for the generation of the operation clock with a lower frequency from a low original oscillation frequency. Further, the frequency divider circuit is also used for the generation of a plurality of frequency-divided clocks so that the frequency can be changed according to a section to be operated for the purpose to reduce a ratio of portions operating at a high frequency.

To provide controls over operation clock with a PLL oscillation circuit or a frequency divider circuit, it is required to discretely control each function unit or set contents. In other words, it is necessary to set a complicated program. For instance, when a multiplication factor in a PLL oscillation circuit is to be changed, at first the clock source is switched to other clock so that the PLL output clock is not used, and then a multiplication factor setting is changed. No operation is performed until the oscillation because of the changed multiplication factor is stabilized. Once the oscillation is stabilized, the clock source is again switched to the PLL output clock.

Further, it is necessary to set a ratio for dividing a clock frequency to an optimal value according to a multiplication factor in the PLL oscillation circuit. For instance, in a case of a circuit for executing communications or the like, at first an operation frequency is fixed at a constant level. When the operation frequency of a CPU (central processing unit) is changed to a higher or lower value, it is required to change the setting of not only the multiplication factor, but also the frequency division ratio. All of these operations are discretely and successively executed by a program.

As described above, control over the operation clock is very complicated. Accordingly, the program structure becomes complicated and the program size also increases. Further, a time required for changing the setting of the multiplication factor or the frequency division ratio becomes disadvantageously longer. Further, precise control over the operation speed can not be provided due to generation of mistakes in setting or due to malfunctions. This disadvantageously increases power consumption.

When the multiplication factor in the PLL oscillation circuit is set at a high value to generate a high frequency and only a frequency division ratio for the used clock frequency, it is possible to reduce the complication in the setting work. With this system, however, it is impossible to reduce the power consumption in the PLL oscillation circuit and in the frequency divider circuit.

SUMMARY OF THE INVENTION

This invention is achieved in view of the problems explained above. It is an object of this invention to provide a clock control circuit which can reduce the complication in control over the operation clock and also which can easily realize precise control over the operation speed.

To achieve the object described above, according to one aspect of the present invention, when it is detected that the PLL output clock output from an PLL oscillation circuit is unstable, a clock state controller provides a series of controls (1) to (4) described below. (1) Output of clock to the outside is stopped. (2) The clock is switched from the PLL output clock to an another clock. (3) After the PLL output clock is stabilized, the clock is switched back to the PLL output clock. (4) Clock generated based on the PLL output clock is output to the outside.

Further, a multiplication factor supplied from a multiplication factor setting unit is once stored in a buffer unit, and the multiplication factor setting data stored in the buffer unit is output to a frequency divider circuit for the generation of feed-back clock.

According to another aspect of the present invention, when setting of a multiplication factor in the PLL oscillator is changed by the multiplication factor setting unit, as multiplication factor setting data output from the multiplication factor setting unit is different from the current multiplication factor setting data output from the buffer unit, so that a series of controls (1) to (5) described below are executed. (1) Output of clock to the outside is stopped. (2) The clock is switched from the PLL output clock to an another clock. (3) The multiplication factor setting data output from the buffer unit is made coincident to those output to the multiplication factor setting unit. (4) After the PLL output clock is stabilized, the clock is switched to the PLL output clock. (5) Clock generated based on the PLL output clock is output to the outside.

Other objects and features of this invention will become apparent from the following description with reference to the accompanying drawings.

DESCRIPTION OF THE PREFERRED EMBODIMENTS

A clock control circuit according to one embodiment of the present invention is described in detail with reference to FIG. 1 to FIG. 5.

Figure 1:
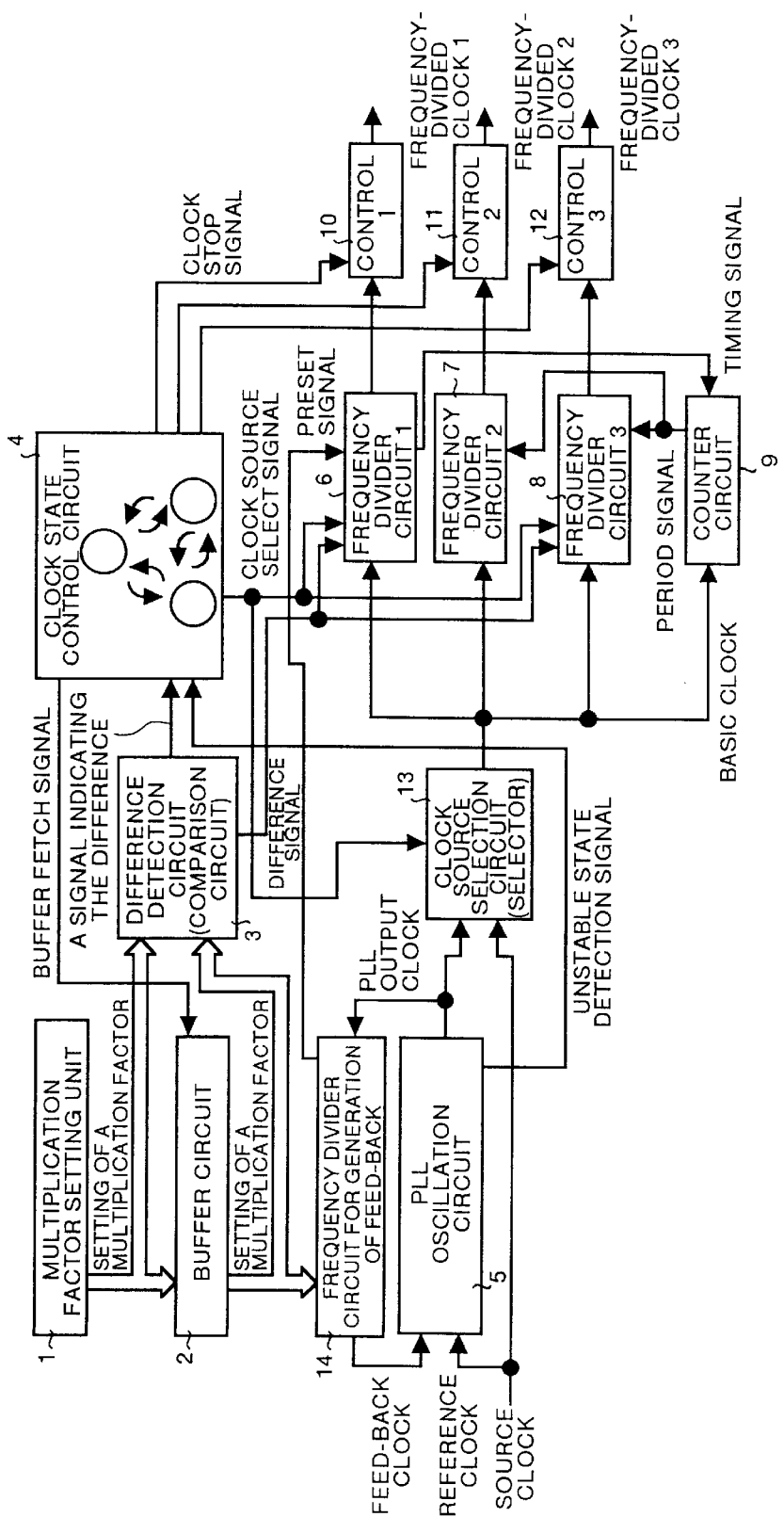
FIG. 1 a block diagram showing an example of the configuration of a clock control circuit according to one embodiment of the present invention.

FIG. 1 is a block diagram showing an example of the configuration of the clock control circuit according to one embodiment. This clock control circuit comprises a multiplication factor setting unit 1, a buffer circuit 2, a difference detection circuit (comparison circuit) 3, a clock state control circuit 4, a PLL oscillation circuit 5, a not-specified number of (for instance, three) frequency divider circuits 6, 7, 8, a counter circuit 9, frequency-divided clock output control circuits 10, 11, 12 (the number is not limited to three), a clock source selection circuit (selector) 13, and a frequency divider circuit 14 for generation of feed-back clock.

The multiplication factor setting unit 1 supplies multiplication factor setting data for setting a multiplication factor in the PLL oscillation circuit 5 to the buffer circuit 2 and the difference detection circuit 3. The multiplication factor setting unit 1 outputs, for instance, a multiplication factor setting register value, as multiplication factor setting data, set by a program executed by a CPU.

The multiplication factor setting unit 1 has a multiplication factor setting terminal which is not shown in this figure. The multiplication factor setting unit 1 outputs a value input into this multiplication factor setting terminal from the outside as the multiplication factor setting data. Further, the multiplication factor setting unit 1 outputs multiplication factor setting data based on a signal output from any logic circuit in another control block.

In other words, the clock control circuit according to the present invention can set the multiplication factor in the PLL oscillation circuit with a program or according to data input from the outside. Further, the clock control circuit according to the present invention can set the multiplication factor in response to the conditions inside the clock control circuit. Therefore, it is possible to select a control method suited to each discrete system using this clock control circuit.

The buffer circuit 2 fetches the multiplication factor setting data supplied from the multiplication factor setting unit 1 based on a buffer fetch signal supplied from the clock state control circuit 4. The buffer circuit 2 supplies the fetched multiplication factor setting data to the frequency divider circuit 14 for generation of feed-back clock as well as to the difference detection circuit 3.

When the buffer fetch signal is not input, even if the multiplication factor setting data supplied from the multiplication factor setting unit 1 changes, the buffer circuit 2 does not fetch the changed multiplication factor setting data. In this case, the buffer circuit 2 continues to supply the multiplication factor setting data fetched previously to the frequency divider circuit 14 for generation of feed-back clock as well as to the difference detection circuit 3.

The difference detection circuit 3 compares the multiplication factor setting data supplied from the multiplication factor setting unit 1 to those supplied from the buffer circuit 2. When the result of comparison indicates that the two types of multiplication factor setting data are not identical, the difference detection circuit 3 supplies a signal indicating that the two data are different to the clock state control circuit 4.

The difference detection circuit 3 again compares the multiplication factor setting data supplied from the multiplication factor setting unit 1 to those supplied from the buffer circuit 2. The difference detection circuit 3 then supplies the difference between the two types of multiplication factor setting data as a difference output to each of the frequency divider circuits 6, 7, 8 for generation of frequency-divided clocks.

The frequency divider circuit 14 for generation of frequency-divided clock generates feed-back clock by dividing a frequency of the PLL output clock supplied from the PLL oscillation circuit 5. Further, the frequency divider circuit 14 for generation of feed-back clock supplies the operation timing signal as a preset signal to the particular frequency divider circuit 6 for generation of frequency-divided clock.

The PLL oscillation circuit 5 generates PLL output clock based on the feed-back clock supplied from the frequency divider circuit 14 for generation of feed-back clock and the source clock which work as the reference clock. The PLL oscillation circuit 5 supplies an unstable state detection signal to the clock state control circuit 4 when the locked state becomes unstable.

The clock state control circuit 4 receives a state shift condition in response to the unstable state detection signal supplied from the PLL oscillation circuit 5 or the signal indicating the difference in the data supplied from the difference detection circuit 3. The clock state control circuit 4 supplies a clock source select signal to the clock source selection circuit 13 as well as to each of the frequency divider circuits 6, 7, 8 for generation of frequency-divided clocks. The clock state control circuit 4 outputs a clock stop signal to each of frequency-divided clock output control circuits 10, 11, and 12. The control process by the clock state control circuit 4 is described later.

The clock source selection circuit 13 selects either the PLL output clock supplied from the PLL oscillation circuit 5 or the source clock not passing through the PLL oscillation circuit 5 and directly supplied from the outside based on the clock source select signal supplied from the clock state control circuit 4. The selected clock is output as a basic clock to the frequency divider circuits 6, 7, and 8 for generation of frequency-divided clocks.

The frequency divider circuits 6, 7, and 8 for generation of frequency-divided clocks set the frequency division ratio to a certain value based on a combination of the clock source select signal supplied from the clock state control circuit 4 and the signal indicating a difference in the two types of multiplication factor setting data supplied from the difference detection circuit 3. The frequency divider circuits 6, 7, 8: for generation of frequencydivided clocks generate frequency-divided clocks by dividing a frequency of the basic clock supplied from the clock source selection circuit 13 based on the set frequency division ratio. The generated frequency-divided clocks are supplied to the respectively frequency-divided clock output control circuits 10, 11, and 12.

In order to synchronize the reference clock (source clock) input into the PLL oscillation circuit 5 to frequency-divided clocks output from each of the frequency divider circuits 6, 7, 8 for generation of frequency-divided clocks, the particular frequency divider circuit 6 for generation of frequency-divided clocks executes a preset operation at a specific timing based on the preset signal supplied from the frequency divider circuit 14 for generation of feed-back clock. The frequency divider circuit 6 for generation of frequency-divided clocks is synchronized to the other frequency divider circuits 7 and 8 for generation of frequency-divided clock through a counter circuit 9 which is described in detail below.

The particular frequency divider circuit 6 supplies the operation timing signal to the counter circuit 9. The counter circuit 9 starts counting the basic clock supplied from the clock source selection circuit 13 based on the operation timing signal supplied from the frequency divider circuit 6 for generation of frequency-divided clock. The counter circuit 9 generates a synchronization signal after passage of an offset timing which can be set as desired, and supplies the synchronization signal to the other frequency divider circuits 7, 8 for generation of frequency-divided clocks.

The frequency-divided clock output control circuits 10, 11, 12 control the output/no-output of frequency-divided clocks supplied from the frequency divider circuits 6, 7, 8 for generation of frequency-divided clocks based on the clock stop signal supplied from the clock state control circuit 4.

Figure 2:
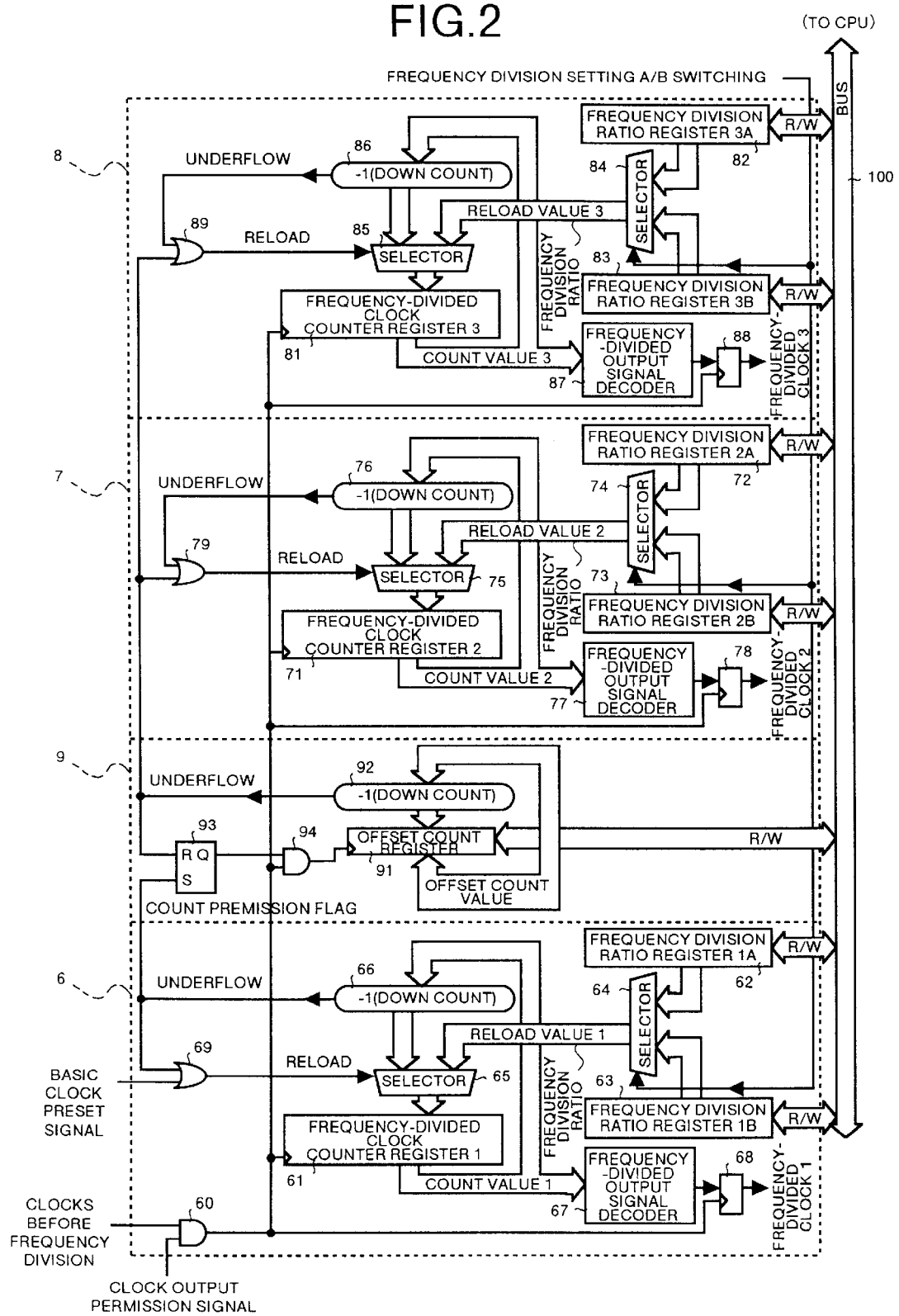
FIG. 2 is a block diagram showing in detail a frequency divider circuit, a counter circuit, and a frequency-divided clock output control circuit in the clock control circuit according to the embodiment.

FIG. 2 is a block diagram showing in detail the frequency divider circuits 6, 7, 8 for generation of frequency-divided clocks, counter circuit 9, and frequency-divided clock output control circuits 10, 11, 12 in the clock control circuit according to the present embodiment.

The frequency divider circuit 6 for generation of frequency-divided clocks comprises a frequency-divided clock counter register 61, frequency division ratio setting registers 62, 63 (although two units are shown, the number is not limited to two), two selectors 64, 65, a down count section 66, a frequency-divided output signal decoder 67, a latch circuit 68, an OR circuit 69, and an AND circuit 60.

The frequency division ratio setting registers 62, 63 store therein a value for a frequency division ratio transmitted through a bus 100 from the CPU. The selector 64 selects any one of the frequency division ratio values stored in the two frequency division ratio setting registers 62, 63 based on a frequency division setting select signal input from the outside. The selected frequency division ratio value is supplied as a reload value to the other selector 65. A value output by the down counter section 66 is also supplied to this selector 65.

The selector 65 selects a reload value supplied by the selector 64 when a reload signal is input, and then sets the reload value in the frequency-divided clock counter register 61. On the contrary, when the reload signal is not input, the selector 65 selects the value output by the down count section 66, and supplies this value to the frequency division counter register 61.

The reload signal is output from the OR circuit 69 which receives two types of signal, namely a preset signal supplied from the frequency divider circuit 14 for generation of feed-back clock and an underflow signal which is generated when underflow occurs in the down count section 69. The selector 65 sets the reload value as a count value in the frequency-divided clock counter register 61 when the preset signal or underflow signal is input.

When neither a pre-set signal nor the underflow signal is input, a count value in the frequency-divided clock counter register 61 is decreased one by one in the down count section 66. The timing for updating is decided based on an output signal from the AND circuit 60 which receives two types of signal, namely clock before frequency division (basic clock) and a clock output permission signal. In other words, a count value in the frequency-divided clock counter register 61 is updated in synchronism to the clock before frequency division when output of frequency-divided clock is permitted.

The frequency-divided output signal decoder 67 generates frequency-divided output clock by decoding the count value in the frequency-divided clock counter register 61. The generated frequency-divided output clock is supplied to the latch circuit 68. The latch circuit 68 outputs frequency-divided clock based on an output signal from the AND circuit 60. In other words, the frequency-divided clock is output, when output thereof is permitted, in synchronism to clock before frequency division. The clock output permission signal corresponds. to output of a clock stop signal supplied from the clock state control circuit 4. Therefore, the AND circuit 60 and the latch circuit 68 has functions of the frequency-divided clock output control circuit 10.

The counter circuit 9 comprises an offset counter register 91, a down count section 92, a count permission flag section 93, and an AND circuit 94. The count permission flag section 93 is, for instance, a RS-flip-flop circuit. This flip-flop circuit is set in response to an underflow supplied from the down count section 66 in the frequency divider circuit 6 for generation of frequency-divided clock.

The underflow signal supplied from the down count section 66 corresponds to a timing signal supplied from the frequency divider circuit 6 for generation of frequency-divided clock to the frequency divider circuit 9. In other words, a flag is set in the count permission flag section 93 based on the timing signal. The flip-flop circuit constituting the count permission flag section 93 is set in response to an underflow signal generated when underflow occurs in the down count section 92.

A value of a flag set in the count permission flag section 93, namely a Q output from the RS-flip-flop circuit is input together with an output from the AND circuit 60 in the frequency divider circuit 6 for generation of frequency-divided clock into the AND circuit 94. The offset counter register 91 operates based on an output from this AND circuit 94. In other words, when start of counting by the count permission flag section 93 and at the same time output of frequency-divided clock is permitted, the offset count value in the offset counter register 91 is decreased by one by the down count section 92 in synchronism to clock before frequency division. An initial value of the offset count value is sent through the bus 100 from the CPU.

The frequency divider circuit 7 for generation of frequency-divided clock comprises a frequency-divided clock counter register 71, frequency division ratio setting registers 72, 73 (although two units are shown the number is not limited to two), two selectors 74, 75, a down count section 76, a frequency-divided output signal decoder 77, a latch circuit 78, and an OR circuit 79.

The frequency divider circuit 8 for generation of frequency-divided clock comprises a frequency-divided clock counter register 81, frequency division ratio setting register 82, 83 (although two units are shown the number is not limited to two), two selectors 84, 85, a down count section 86, a frequency-divided output signal decoder 87, a latch circuit 88, and an OR circuit 89.

The frequency-divided clock counter register 71, frequency division ratio setting registers 72, 73, selectors 74, 75, down count section 76, frequency-divided output signal decoder 77 and latch circuit 78, and further the frequencydivided clock counter register 81, frequency division ratio setting registers 82, 83, selectors 84, 85, down count section 86, frequency-divided output signal decoder 87, and latch circuit 88 are the same as the frequency-divided clock counter register 61, frequency division ratio setting registers 62, 63, selectors 64, 65, down count section 66, frequency-divided output signal decoder 67, and latch circuit 68 in the frequency divider circuit 6 for generation of frequency-divided clock respectively, so that there description will be omitted.

In the frequency divider circuit 7 for generation of frequency-divided clock, a reload signal is output from the OR circuit 79 which receives two types of signal, namely an underflow signal supplied from the down count section 92 in the counter circuit 9 and an underflow signal generated when underflow occurs in the down count section 76 in the frequency divider circuit 7.

In the frequency divider circuit 8 for generation of frequency-divided clock, the reload signal is output from the OR circuit 89 which receives two types of signal, namely an underflow signal supplied from the down count section 92 in the counter circuit 9 and an underflow signal generated when underflow occurs in the down count section 86 in the frequency divider circuit 8.

The underflow signal supplied from the down count section 92 in the counter circuit 9 corresponds to a synchronization signal supplied from the counter circuit 9 to the frequency divider circuits 7, 8 for generation of frequency-divided clock. The AND circuit 60 in the frequency divider circuit 6 for generation of frequency-divided clock and latch circuit 78 in the frequency divider circuit 7 for generation of frequency-divided clock, and the AND circuit 60 in the frequency divider circuit 6 for generation of frequency-divided clock and latch circuit 88 in the frequency divider circuit 8 for generation of frequency-divided clock have the same functions as those of the frequency-divided clock output control circuit 11 and frequency-divided clock output control circuit 12.

Figure 3:
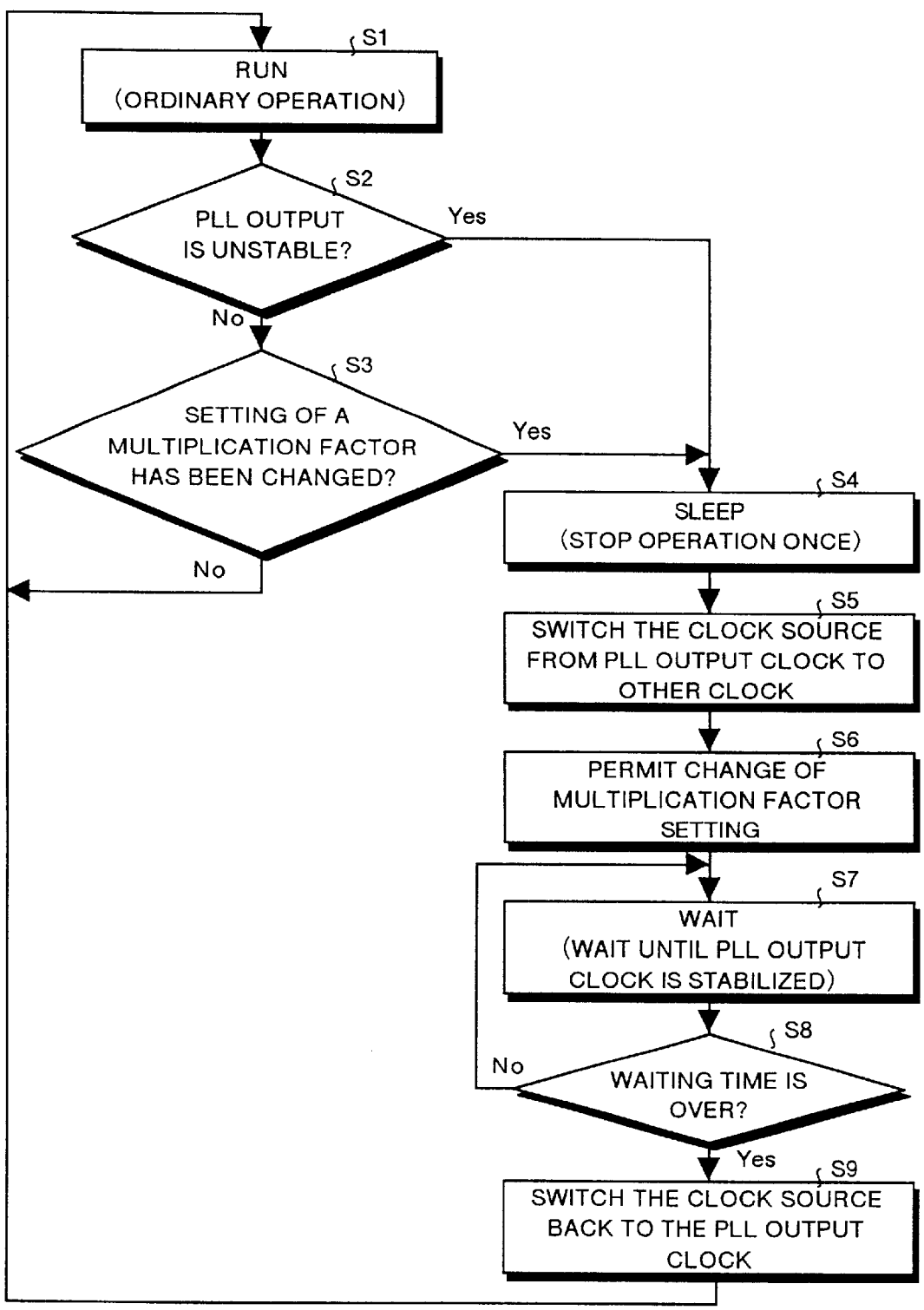
FIG. 3 a flow chart showing an example of control process by a clock state control circuit in the clock control circuit according to the present embodiment.

Operations of the clock control circuit according to the present invention are described below. FIG. 3 is a flow chart showing an example of contents of the control processing executed by the clock state control circuit 4.

In the flow chart shown in FIG. 3, when the clock state control circuit 4 is executing the ordinary operation (namely, when it is running), the clock state control circuit 4 makes the clock source selection circuit 13 select the PLL output clock which are output from the PLL oscillation circuit 5. Accordingly, the clock output by the PLL oscillation circuit 5 become the clock source.

During execution of the ordinary operations, the PLL output clock is stable, and the clock state control circuit 4 permits output of frequency-divided clock from the frequency-divided clock output control circuits 10, 11, 12. With this operation, frequency-divided clock generated in the frequency divider circuits 6, 7, 8 for generation of frequency-divided clocks are output to the outside. The CPU operates based on the output frequency-divided clock, and the processing is executed based on a prespecified program (step S1).

When the PLL output clock output from the PLL oscillation circuit 5 are stable (step S2, NO), and at the same time when no change is made in setting a multiplication factor in the PLL oscillation circuit 5 (step S3, NO), the clock state control circuit 4 continues its ordinary operation. On the contrary, when it is determined in step S2 based on the unstable state detection signal output from the PLL oscillation circuit 5 that the PLL output clock is not stable (step S2, YES), the clock state control circuit 4 starts the process of changing the clock in step S4 and on.

When it is determined in step S3 based on a signal indicating a difference output from the difference detection circuit 3 that a multiplication factor is about to be changed by the multiplication factor setting unit 1 (step S3, YES), the clock state control circuit 4 starts the processing for changing the clocks in step S4 and on.

When the process of changing the clock is started, the clock state control circuit 4 stops the operation once, and enters the sleeping state. In this sleeping state, the operating clock source is still the clock from the PLL oscillation circuit 5. The clock state control circuit 4 supplies a clock stop signal to the frequency-divided clock output control circuits 10, 11, 12 to stop output of frequency-divided clocks. With this operation, the frequency-divided clocks generated by the frequency divider circuits 6, 7, 8 for generation of frequency-divided clocks are not output to the outside with operations of the CPU stopped, and the processing by a program is once stopped (step S4).

The clock state control circuit 4 supplies a clock source select signal to the clock source selection circuit 13 so that clock other than the PLL output clock, for instance, the clock input into the PLL oscillation circuit 5 as the reference clock will be selected as the clock source. With this operation, the clock source is switched to the PLL input clock (source clock) The frequency-divided clock output control circuits 10, 11, 12 do not output frequency-divided clocks (step S5).

The clock state control circuit 4 supplies a buffer fetch signal to the buffer circuit 2, and permits updating in setting of a multiplication factor. With this operation, the buffer circuit 2 fetches multiplication factor setting data supplied from the multiplication factor setting unit 1. The clock source is still the PLL input clock, and the frequency-divided clock output control circuits 10, 11, 12 do not output frequency-divided clocks (step S6).

When a multiplication factor setting value is changed, PLL output clock output from the PLL oscillation circuit 5 become unstable. Therefore, the clock state control circuit 4 are held in the stand-by state until a preset period of time passes. Even when a multiplication factor setting value is not changed, the clock state control circuit 4 is held in the stand-by state until a prespecified period of time passes.

The stand-by state is maintained for a period of time sufficient to stabilize the PLL output clock. The clock source is still the PLL input clock, and the frequency-divided clock output control circuit 10, 11, 12 do not output frequency-divided clocks (step S7).

When the prespecified period of time passes (step S8, YES), the clock state control circuit 4 makes the clock source selection circuit 13 select PLL output clock output from the PLL oscillation circuit 5 as clock source. With this operation, the clock source is switched to the PLL output clock. Therefore, the frequency-divided clock output control circuits 10, 11, 12 do not output frequency-divided clock (step S9).

The clock state control circuit 4 then restarts the operation, and returns to the ordinary operation. With this operation, frequency-divided clocks generated by the frequency divider circuits 6, 7, 8 for generation of frequency-divided clocks based on the PLL output clock is output from the frequency-divided clock output control circuits 10, 11, 12 to the outside. Therefore, the CPU restarts its operation, and execution of the program according to a program is restarted (step S1). The above-described processing sequence is then repeated.

Figure 4:
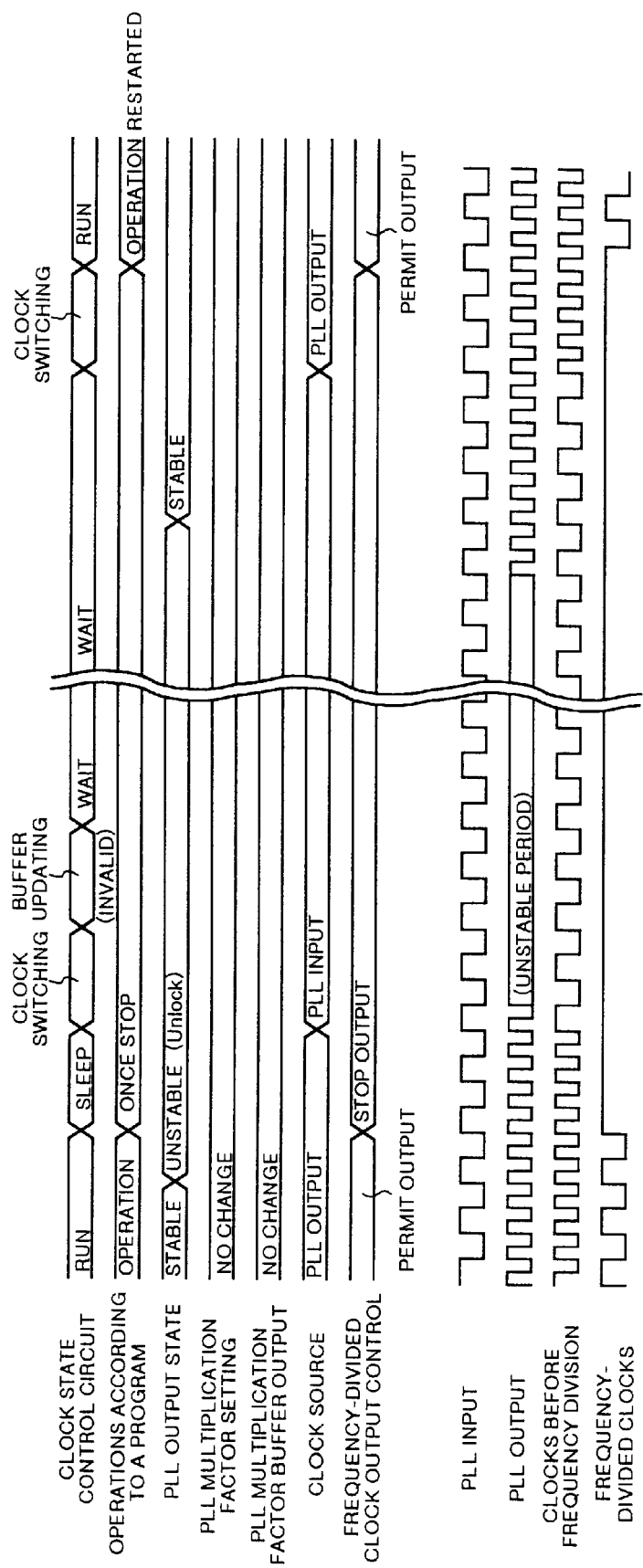
FIG. 4 is a timing chart showing an example of a clock state control sequence executed by the clock control circuit according to the present embodiment when PLL output clock become unstable.

FIG. 4 shows an example of timing chart for a clock state control sequence when PLL output clock from the PLL oscillation circuit 5 become unstable.

In the timing chart shown in FIG. 4, when the clock state control circuit 4 is performing its ordinary operation (namely when it is running), the clock state control circuit 4 makes the clock source selection circuit 13 select the PLL output clock output from the PLL oscillation circuit 5 as clock source. Thus, the clock source is switched to the PLL output clock.

During this ordinary operation, the PLL output clock is stable,; and the clock state control circuit 4 permits the frequency-divided clock output control circuits 10, 11, 12 to output frequency-divided clock. The PLL output clock output from the PLL oscillation circuit 5 are stable.

When it is determined based on the unstable state detection signal output from the PLL oscillation circuit 5 that the PLL output clock is unstable, the clock state control circuit 4 stops the operation once, and enters the sleeping state. In this sleeping state, the clock source is still the PLL output clock. The clock state control circuit 4 supplies a clock stop signal to the frequency-divided clock output control circuit so that output of frequency-divided clocks will be stopped.

The clock state control circuit 4 supplies a clock source select signal to the clock source selection circuit 13 so that the clock other than the PLL output clock, for instance, PLL input clock input as reference clock into the PLL oscillation circuit 5 are selected. Thus, the clock source is switched to the PLL input clock. In this state, the frequency-divided clock output control circuits 10, 11, 12 do not output frequency-divided clocks.

The clock state control circuit 4 then enters and is held in the stand-by state (WAIT) until a prespecified period of time passes. The stand-by time is set to a period of time sufficient for the PLL output clock to get stabilized. The clock source is still the PLL input clock (source clock), and the frequency-divided clock output control circuits 10, 11, 12 do not output frequency-divided clock.

When the prespecified period of time passes, the PLL output clock is stabilized, and the clock state control circuit 4 makes the clock source selection circuit 13 select the PLL output clock as the clock source. Thus, the clock source is switched to the PLL output clock. In this state, the frequency-divided clock output control circuits 10, 11, 12 do not output the frequency-divided clock.

The clock state control circuit 4 then restarts the operation, and returns to the ordinary operation. With this operation, frequency-divided clocks generated by the frequency divider circuits 6, 7, 8 for generation of frequency-divided clocks based on the PLL output clock is output from the frequency-divided clock output control circuits 10, 11, 12 to the outside. Therefore the CPU restarts its operation, and the processing according to a program is restarted.

Figure 5:
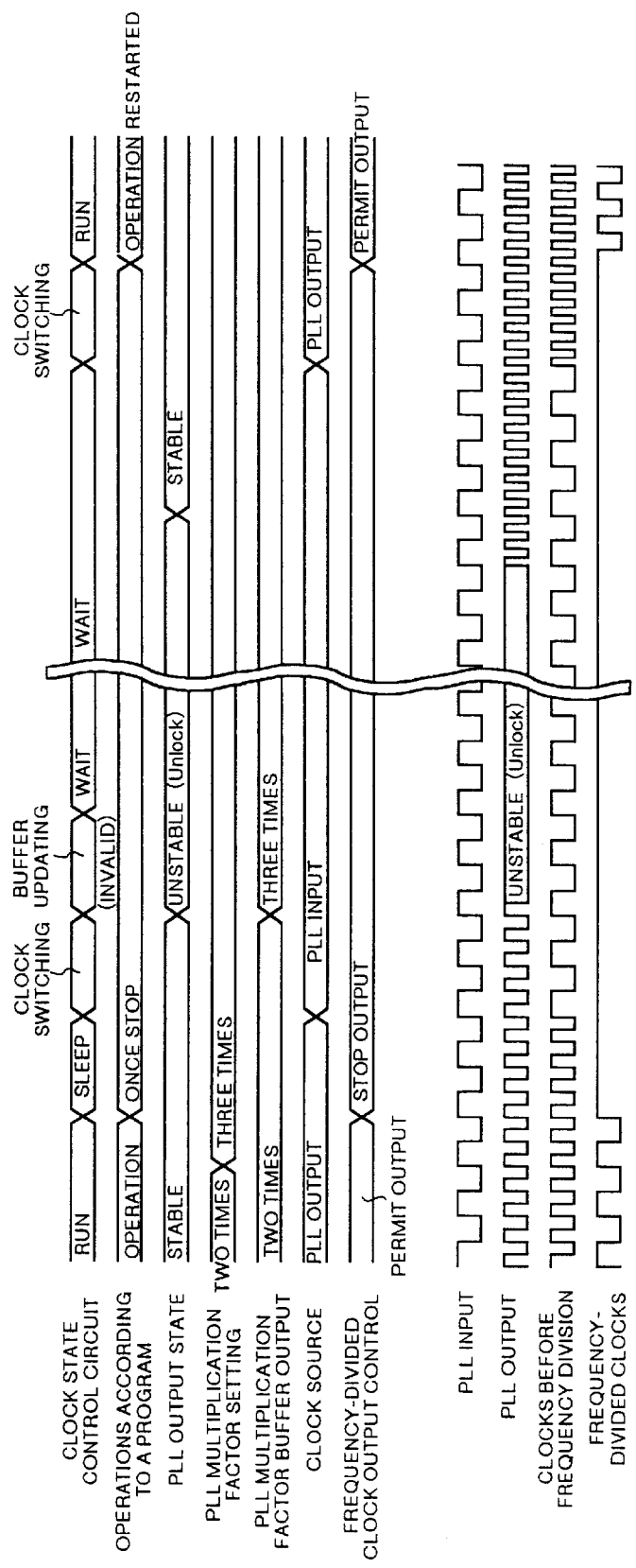
FIG. 5 is a timing chart showing an example of a clock state control sequence executed by the clock control circuit according to the present embodiment when setting of the PLL multiplication factor is changed.

FIG. 5 is a timing chart showing an example of a clock state control sequence when setting of a multiplication factor in the PLL oscillation circuit 5 is changed.

In the timing chart shown in FIG. 5, like in the timing chart shown in FIG. 4, when the clock state control circuit 4 is executing its ordinary operation (namely, when it is running), the clock state control circuit 4 makes the clock source selection circuit 13 select the PLL output clock as the clock source. Thus, the clock source is switched to the PLL output clock.

During the ordinary operation, the PLL output clock is stable, and the clock state control circuit 4 permits output of frequency-divided clocks from the frequency-divided clock output control circuits 10, 11, 12.

When it is determined in this step from a signal indicating difference output from the difference detection circuit that a multiplication factor is about to be changed by the multiplication factor setting unit 1, namely that the multiplication factor is about to be changed, for instance, from "two" to "three", the clock state control circuit 4 once stops the operation, and enters into a sleeping state. In this sleeping state, the clock source is still the PLL output clock. Then the clock state control circuit 4 supplies a clock stop signal to the frequency-divided clock output control circuits 10, 11, 12 so as to stop the output of the frequency-divided clock.

The clock state control circuit 4 then supplies a clock source select signal to the clock source selection circuit 13 so that clock other than the PLL output clock, for instance, PLL input clock which are input as the reference clock to the PLL oscillation circuit are selected as the clock source. With this operation, the clock source is switched to the PLL input clock. Accordingly, the frequency-divided clock output control circuits 10, 11, 12 do not output the frequency-divided clock.

The clock state control circuit 4 then supplies a buffer fetch signal to the buffer circuit 2, and permits updating in setting of the multiplication factor. With this operation, the buffer circuit 2 fetches the multiplication factor setting data supplied from the multiplication factor setting unit 1. The clock source is the PLL input clock, therefore, the frequency-divided clock output control circuits 1, 11, 12 do not output the frequency-divided clock.

When a multiplication factor setting value is changed, the PLL output clock become unstable. Therefore, the clock state control circuit 4 enters and is held in the stand-by state (WAIT) until the prespecified period of time passes. The processing sequence in the subsequent step and on is the same as that shown in the timing chart in FIG. 4, so that description thereof is omitted herein.

With the embodiment of the present invention as described above, multiplication factor setting data output from the multiplication factor setting unit 1 is compared to the current multiplication factor setting data output from the buffer circuit 2, and when the two are different from each other, the clock state control circuit 4 provides a control to: 1) stop the output of clock to the outside, 2) switch the clock source to the clock other than the clock output from the PLL oscillation circuit 5, 3) change the multiplication factor if the multiplication factor setting data has been changed, 4) when the PLL output clock is stabilized, switches the clock source to the PLL output clock; and 5) restart the output of a newly generated clock to the outside.

Because of this feature, by changing a multiplication factor with the multiplication factor setting unit 1, controls for setting and changing operation clock in the subsequent steps can automatically and safely be executed according to a prespecified state withoutdependingonaprogram flow. Therefore, it is possible to reduce complication in control over operating clock in a clock control circuit and precise controls over an operating speed can easily and accurately be realized. Because of this feature, waste in power consumption can be reduced, so that the clock control circuit according to the present invention is best suited for portable equipment such as a portable telephone, or for other types of electric equipment such as a digital camera or car audio equipment.

Description of the embodiment above assumes that three frequency divider circuits for generation of frequencydivided clocks are provided, but the present invention is not limited to this configuration, and a number of frequency divider circuits for generation of frequency-divided clocks may be one, two, four or more.

With the present invention, when setting of a multiplication factor is changed, or when a locking state of PLL becomes unstable, the clock state control circuit 4 stops the output of the operating clock to the outside and switches clock source to a clock other than the PLL output clock. When a multiplication factor is to be changed, the clock state control circuit 4 sets the new multiplication factor, and waits for stabilization of PLL output clock, and after the PLL output clock is stabilized, again switches the clock source to the PLL output clock to restart the output of the clock to the outside. With this feature, complication in control over operating clock can be reduced, and more precise and accurate control over an operating speed can easily be realized.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A clock control circuit comprising:
   a PLL oscillator which receives a reference clock from an outside and outputs a PLL output clock based on the reference clock;
   a detector which outputs a state detection signal indicating stableness or unstableness of the PLL output clock;
   a clock source selector which receives the reference clock and the PLL output clock and selectively outputs either of the reference clock and the PLL output clock as a basic clock;
   an output circuit which receives the basic clock, generates an operating clock to be output to the outside based on the basic clock, and controls output of the operating clock to the outside; and
   a clock state controller which receives the state detection signal and controls said clock source selector and said output circuit based on the state detection signal;
   wherein, when the state detection signal indicates that the PLL output clock is unstable, said clock state controller controls said output circuit so as to stop the output of the operating clock to the outside and controls said clock source selector so as to select the reference clock as the basic clock; and
   when the state detection signal indicates that the PLL output clock has become stable, said clock state controller controls said clock source selector so as to switch the basic clock from the reference clock to the PLL output clock and controls said output circuit so as to restart the output of the operating clock to the outside.

2. The clock control circuit according to claim 1, wherein said output circuit further comprising:
   one or a plurality of frequency dividers for generation of frequency-divided clock which divide a frequency of the basic clock and generate the operating clock.

3. A clock control circuit comprising:
   a PLL oscillator which generates a PLL output clock to be output to the outside based on a reference clock and a feed-back clock;
   a frequency divider for generation of the feed-back clock by dividing a frequency of the PLL output clock output by said PLL oscillator;
   a multiplication factor setting unit which outputs multiplication factor setting data for setting a multiplication factor in said PLL oscillator;
   a buffer unit which fetches the multiplication factor setting data from said multiplication factor setting unit when fetching of the multiplication factor setting data is allowed, and outputs the fetched multiplication factor setting data to said frequency divider for generation of the feed-back clock;
   a comparator which compares the multiplication factor setting data output by said multiplication factor setting unit with the multiplication factor setting data output by said buffer unit;
   a clock source selector which changes over the clock source between the PLL output clock and the reference clock and outputs a basic clock; and
   a clock state controller which provides first control when a result of comparison in said comparator indicates that the two multiplication factor setting data are different from each other, said first control including stopping output of an operating clock which is generated based on the basic clock to the outside; controlling said clock source selector so as to switch the clock source from the PLL output clock to the reference clock; and making the multiplication setting data output by said buffer unit identical to the multiplication setting data output by said multiplication factor setting unit, and provides a second control when the PLL output clock is stabilized, said second control including controlling said clock source selector so as to switch the clock source from the reference clock back to the PLL output clock; generating the operating clock based on the PLL output clock; and outputting the operating clock to the outside.

4. The clock control circuit according to claim 3 further comprising:
   a difference detection unit which obtains a difference between the multiplication factor setting data output by said multiplication factor setting unit and the multiplication factor setting data output by said buffer unit and outputs the difference; and
   one or a plurality of frequency dividers for generation of frequency-divided clock which sets into itself a frequency division ratio based on switching of the clock source by said clock source selector and the difference between the two multiplication factor setting data output by said difference detection unit, and generates the operating clock by dividing a frequency of the basic clock according to the set frequency division ratio.

5. The clock control circuit according to claim 4, wherein said frequency divider for generation of feed-back clock outputs a first operation timing signal to at least one of said frequency dividers is for generation of frequency-divided clock, and the frequency divider for generation of frequency-divided clock having received the first operation timing signal outputs the operating clock to be output to the outside in synchronization with the PLL output clock based on the first operation timing signal and outputs a second operation timing signal based on the first operation timing signal.

6. The clock control circuit according to claim 5 further comprising:
   a counter which receives the second operation timing signal and synchronizes, based on the second operation timing signal, the operation of the other frequency dividers for generation of frequency-divided clock at an offset timing which can be set as desired.

7. A clock control circuit comprising:
- a PLL oscillator which generates a PLL output clock based on a reference clock;
- a detector which detects stableness or unstableness in the PLL output clock;
- a clock source selector which receives the reference clock and the PLL clock, selects any one of the two clocks and outputs the selected clock as a basic clock;
- a clock processing unit which receives the basic clock output by said clock source selector, processes the received clock and outputs the processed clock to the outside as an operating clock; and
- a clock state controller which receives a result of detection in said detector and controls the operation of at least said clock source selector and said clock processing unit,
- wherein said clock state controller controls said clock processing unit so as to stop the output of the operating clock to the outside, and controls said clock source selector so as to select and output the reference clock when said clock state controller receives a result of detection from said detector that indicates that the PLL output clock is unstable, and said clock state controller controls said clock source selector so as to select and output the PLL output clock as the basic clock, controls said clock processing unit so as to generate the operating clock based on the PLL output clock output by said clock source selector and output the operating clock to the outside when said clock state controller receives a result of detection from said detector that indicates that the PLL output clock has become stable.

8. The clock control circuit according to claim 7 further comprising an oscillator which generates and outputs the reference clock.

9. The clock control circuit according to claim 7, wherein said clock processing unit has at least one frequency divider which divides the frequency of the basic clock obtained from said clock source selector and outputs the frequency-divided clock to the outside as the operating clock.

10. A clock control circuit comprising:
- a PLL oscillator which generates a PLL output clock based on a reference clock and a feed-back clock using a multiplication factor;
- a feed-back clock generator which receives the PLL output clock of said PLL oscillator, generates the feed-back clock by dividing a frequency of the PLL output clock and outputs the feed-back clock to said PLL oscillator;
- a multiplication factor setting unit which outputs a multiplication factor setting data to be utilized for setting the multiplication factor in said PLL oscillator;
- a buffer unit which stores the multiplication factor setting data output by said multiplication factor setting unit, and outputs the multiplication factor setting data to said feed-back clock generator, and overwrites the multiplication factor setting data onto an existing multiplication factor setting data when it receives a fetch signal;
- a comparator which receives the multiplication factor setting data from said multiplication factor setting unit and the multiplication factor setting data from said buffer unit and compares the two multiplication factor setting data;
- a clock source selector which receives the reference clock and the PLL output clock, selects any one of the two clocks and outputs the selected clock as a basic clock;
- a clock processing unit which receives the basic clock output by said clock source selector, processes the received clock and outputs the processed clock to the outside as an operating clock; and
- a clock state controller which receives a result of comparison in said comparator, generates and outputs the fetch signal to said buffer unit, and controls the operation of at least said clock source selector and said clock processing unit,
- wherein said clock state controller controls said clock processing unit so as to stop the output of the operating clock to the outside, controls said clock source selector so as to select and output the reference clock as the basic clock, outputs the fetch signal thereby controlling said buffer unit so as to overwrite the multiplication factor setting data obtained from said multiplication factor setting unit onto the existing multiplication factor setting data, controls said clock source selector so as to select and output the PLL output clock as the basic clock, controls said clock processing unit so as to generate the operating clock based on the PLL output clock output by said clock source selector and output the operating clock to the outside when said clock state controller receives a result of comparison from said comparator that indicates that the two multiplication factor setting data are different from each other.

11. The clock control circuit according to claim 10 further comprising an oscillator which generates and outputs the reference clock.

12. The clock control circuit according to claim 10 further having a difference calculating unit which receives the multiplication factor setting data from said multiplication factor setting unit and the multiplication factor setting data from said buffer unit and calculates a difference between the two multiplication factor setting data,
- said clock processing unit having,
  - at least one frequency divider which divides the frequency of the basic clock obtained from said clock source selector based on a frequency division ratio and outputs the frequency-divided clock to the outside as the operating clock; and
  - a frequency division ratio setting unit which receives an information about the basic clock output by said clock source selector and also receives the difference between the two multiplication factor setting data from said difference calculating unit, and sets the frequency division ratio in said frequency divider based on the basic clock output by said clock source selector and the difference between the two multiplication factor setting data.

13. The clock control circuit according to claim 12, wherein said feedback clock generator outputs a timing signal corresponding to its own operation timing to at least one frequency divider in said clock processing unit, and
- said frequency divider that received the timing signal from said feed-back clock generator outputs the frequency-divided clock to the outside in synchronization with the basic clock obtained from said clock source selector based on the timing signal.

14. The clock control circuit according to claim 10 further having a difference calculating unit which receives the multiplication factor setting data from said multiplication factor setting unit and the multiplication factor setting data from said buffer unit and calculates a difference between the two multiplication factor setting data,
- said clock processing unit having, a plurality of frequency dividers which divide the frequency of the clock obtained from said clock source selector based on a frequency division ratio and outputs the frequency-divided clock to the outside as the operating clock, wherein at least one of the plurality frequency dividers outputs a timing signal corresponding to its own operation timing;

a frequency division ratio setting unit which receives an information about the basic clock output by said clock source selector and also receives the difference between the two multiplication factor setting data from said difference calculating unit, and sets the frequency division ratio in said frequency dividers based on the basic clock output by said clock source selector and the difference between the two multiplication factor setting data; and synchronization unit which receives the timing signal and synchronizes the operation of the other frequency divider to the operation of said frequency divider from which the timing signal is received based on the timing signal at a pre-set offset timing.

15. The clock control circuit according to claim 14, wherein said clock processing unit further having an offset timing setting unit for setting the offset timing in said synchronization unit.

16. The clock control circuit according to claim 14, wherein said synchronization unit receives the basic clock output by said clock source selector, starts counting a time from a point of time when the timing signal is received, and synchronizes the operation of the other frequency divider to the operation of said frequency divider from which the timing signal is received when the counted time is equal to the offset timing.

17. The clock control circuit according to claim 10 further comprising a multiplication factor changing unit which changes the multiplication factor setting data in said multiplication factor setting unit.

18. A clock control method comprising:

a detection step of detecting stableness or unstableness of a PLL output clock which is output from a PLL oscillator based on a reference clock;

a first control step on stopping output of an operating clock which is generated based on a basic clock to the outside and selecting the reference clock as the basic clock when unstableness of the PLL output clock is detected;

a second control step of switching the basic clock from the reference clock to the PLL output clock and restarting the output of the operating clock to the outside when stableness of the PLL output clock has been detected.

19. A clock control method comprising:

a comparison step on comparing a multiplication factor setting data to be set newly with a current multiplication factor setting data, said multiplication factor setting data setting a multiplication factor in a PLL oscillator which generates a PLL output clock based on a reference clock;

a first control step on stopping output of an operating clock which is generated based on a basic clock and output to the outside, selecting the reference clock as the basic clock, and making the current multiplication factor setting data identical to the multiplication factor setting data to be set newly when a result of the comparison in said comparison step indicates that the two multiplication factor setting data is different from each other;

a second control step of switching the basic clock from the reference clock to the PLL output clock and restarting the output of the operating clock to the outside when the PLL output clock has been stabilized.

* * * * *